United States Patent
Muthalif et al.

(10) Patent No.: US 7,142,466 B1
(45) Date of Patent: Nov. 28, 2006

(54) DETERMINING OPTIMAL TIME INSTANCES TO SENSE THE OUTPUT OF A MEMORY ARRAY WHICH CAN GENERATE DATA OUTPUTS WITH VARIABLE DELAY

(75) Inventors: Abdul M J Muthalif, Bangalore (IN); Nisha Padattil Kuliyampattil, Bangalore (IN); Krishnan Rengarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/163,318

(22) Filed: Oct. 14, 2005

(51) Int. Cl.
*G11C 7/00* (2006.01)
*G11C 7/02* (2006.01)

(52) U.S. Cl. .................. 365/191; 365/210
(58) Field of Classification Search ............... 365/191
See application file for complete search history.

(56) References Cited

U.S. PATENT DOCUMENTS

| | | | |
|---|---|---|---|
| 5,091,879 A * | 2/1992 | Tran | 365/177 |
| 5,724,294 A * | 3/1998 | Khieu | 365/210 |
| 6,738,296 B1 * | 5/2004 | Sung et al. | 365/189.07 |
| 7,016,245 B1 * | 3/2006 | Balasubramanian et al. | 365/207 |
| 2003/0206448 A1 * | 11/2003 | Sung et al. | 365/189.07 |
| 2004/0078510 A1 * | 4/2004 | Spriggs et al. | 711/100 |
| 2004/0095800 A1 * | 5/2004 | Lin et al. | 365/154 |

* cited by examiner

*Primary Examiner*—Son L. Mai
(74) *Attorney, Agent, or Firm*—Alan K. Stewart; W. James Brady; Frederick J. Telecky, Jr.

(57) ABSTRACT

A tracking circuit in a memory unit which generates sense enable signals at optimal time instances. The tracking circuit includes a scalable driver block containing a number of dummy cells, each having a drive strength identical to the drive strength of a cell in a memory array. The dummy cells are turned on and drive a column as would the memory cells in the memory array. As a result, the scalable driver block approximates the delay caused by (a number of rows in) a column at least when the number of rows is large. An inverse control logic emulates the delay in case of a smaller number of rows, and one of the inverse control logic and the scalable driver blocks provides a pulse, which is used to trigger a sense operation.

16 Claims, 8 Drawing Sheets

DETERMINING OPTIMAL TIME INSTANCES TO SENSE THE OUTPUT OF A MEMORY ARRAY WHICH CAN GENERATE DATA OUTPUTS WITH VARIABLE DELAY

BACKGROUND OF THE INVENTION

The present invention relates to the design of memory units, and more specifically to a method and approach for determining optimal time instances to sense the output of a memory array which can generate data outputs with variable delay.

RELATED ART

A memory array generally contains multiple cells, with each cell typically storing a data bit. The cells can be implemented using technologies such as SRAMs (static random access memories) and DRAM (dynamic RAMs), as is well known in the relevant arts. In general, a memory array generates output signals on corresponding output paths representing the values stored in cells specified by input signals.

The output signals are generally sensed to determine the corresponding bit values. Typically, the strength of the output signals is examined at appropriate time instances, and the corresponding bit value is determined based on the strength.

The time instances (at which sensing occurs) need to be optimal in the sense that sensing too soon might result in a faulty value being sensed, and sensing too late can lead to correspondingly less throughput performance. Accordingly, in the prior art, there has been a recognized need to sense the output signals at optimal times.

Such memory arrays, especially SRAMs, frequently need to be used in general-purpose and application-specific integrated circuits such as DSPs, microprocessors, wireless baseband processors, etc.

Additional challenges are presented when memory arrays can generate output signals with variable delay. For example, the memory arrays are often implemented using 'compiler technologies', in which a high-level designer designs various components of a memory unit (such as decoders, sense amplifiers) which need to work with different configurations of memory arrays.

A later designer may then pick the desired configuration (dimensions of the memory array) of interest suited for specific environment of interest. Thus, by using compiler technologies, the high level designer provides a broad framework supporting various sizes of memory arrays, and the specific configurations are chosen later by several people.

One problem with such environments is that the output signals generated by the memory array experience different delays depending on the configuration of the memory array size. The delays may also be affected by other factors such as (fabrication) process variations, temperature and voltage variations during actual operation. Thus, the optimal time to sense the output signals would vary depending on the specific configuration chosen by the later designers.

In one common prior approach, a "tracking mechanism" is used, which seeks to generate a sense signal indicating the sense instances. In general, the tracking mechanisms contain components which emulate the effects that cause variable delays in the output signal, and thus the sense signal may accurately specify the optimal sense instances.

There is a general need to provide such tracking mechanism which indicates optimal time instances to sense the output of a memory array which can generate data outputs with variable delays (such as in compiler memories noted above).

BRIEF DESCRIPTION OF THE DRAWINGS

The present invention will be described with reference to the following accompanying drawings described briefly below.

DETAILED DESCRIPTION

1. Overview

A tracking mechanism provided according to an aspect of the present invention contains scalable drivers to determine the optimal sense instances to sense the output of a memory array. The use of scalable drivers enables the tracking mechanism to optimally determine sense instances as the memory array size is varied.

Another aspect of the present invention uses an inverse tracking circuit that corrects the timing signal generated by the scalable drivers in the case of a memory array with a small number of rows, and thus enables determination of optimal sense instances for memory arrays of lower configurations (smaller number of rows)

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

2. Example Device

Figure 1:
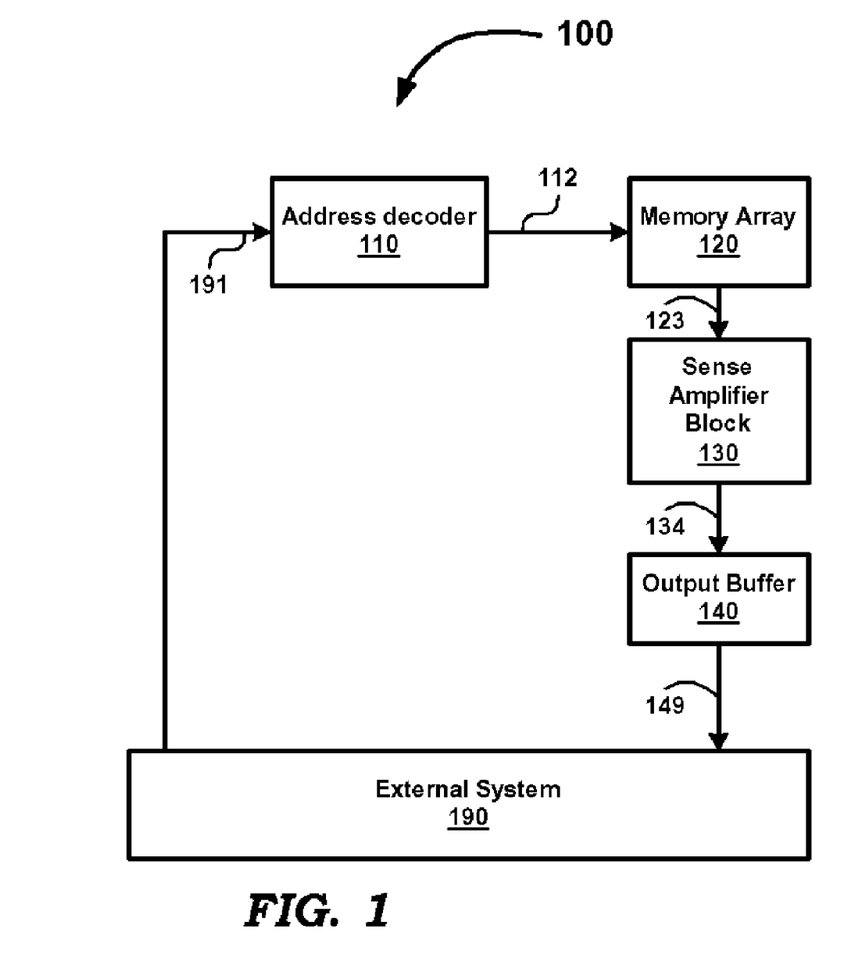
FIG. 1 is a block diagram of an example device in which various aspects of the present invention can be implemented.

FIG. 1 is a block diagram of an example device in which various aspects of the present invention can be implemented. Device 100 is shown containing address decoder 110, memory array 120, sense amplifier block 130, output (O/P) buffer 140, and external system 190. All the components except the external system 190 may be viewed as being contained in a memory unit. Each block is described below in further detail.

Figure 2:
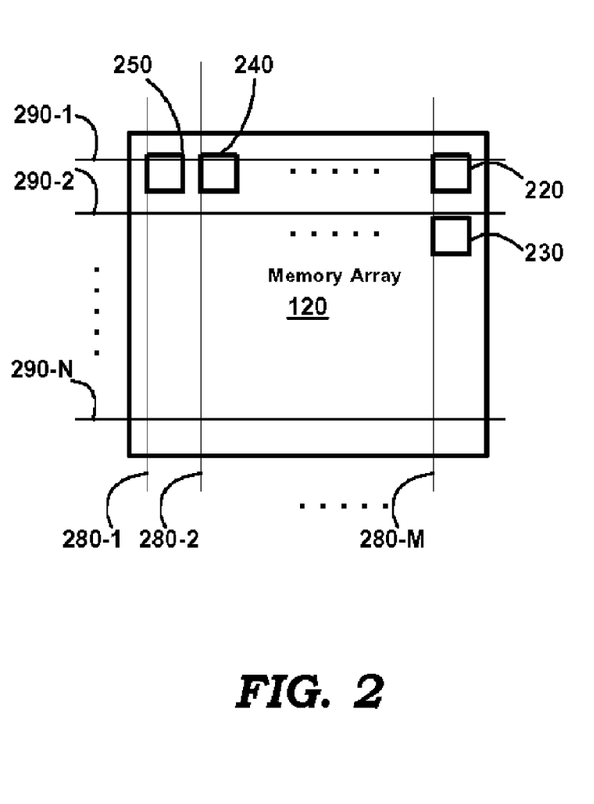
FIG. 2 shows the internal organization of a memory array in one embodiment.

Memory array 120 contains cells organized as rows and columns, as depicted in FIG. 2. As shown in FIG. 2, cells 230, 240 and 220 (others in the row not shown) are provided in a single row, and cells 220 and 230 are provided in a single column (other cells in the column also not shown). All cells in a column connect to (and provide their outputs when enabled) on a single column line. For example, cells 220 and 230 in FIG. 2 provide their outputs on column line 280-M. The cells in a row are enabled by corresponding row enable signals on row lines 290-1 through 290-N (contained in path 112). The bits stored in the cells of an enabled row are provided on column lines 280-1 through 280-M (contained in path 123).

Continuing with reference to FIG. 1, external system 190 sends on path 191 (to address decoder 110) an address (row address) of a word of interest that needs to be read in memory array 120, and receives the value stored in the specified word on path 149. External system 190 may contain various processors (not shown) which generate the address.

Address decoder 110 decodes (determines the specific row) the address and enables the row enable signal corresponding to the received address, which causes the memory cells in the enabled row to output on path 125 (or specifically column lines 280-1 through 280-M) the values of the bits that they store.

Output Buffer 140 provides increased strength (or buffers) to the output bits (received on path 134) of sense amplifier block 130, and the corresponding signals are provided on path 149 to external system 190.

Sense amplifier block 130 senses the output signals generated by memory cell outputs and amplifies them to a level which can be used reliably. The bit values generated as a result are presented on path 134. Sense amplifier block 130 contains one sense amplifier unit for each memory cell in a word (or row) (as shown in further detail in FIG. 3 below). Each sense amplifier unit is connected to a corresponding column line (received from memory array 120) and receives the output of cells in the corresponding column.

In general, each sense amplifier unit needs to sense the corresponding output signal (received from memory array 120) at optimal time instances, as described above in the background section. Some challenges presented in compiler memories type environments in determining such optimal time instances are illustrated below in further detail with reference to FIGS. 3 and 4.

3. Challenges in Sensing at Optimal Times

Figure 3:
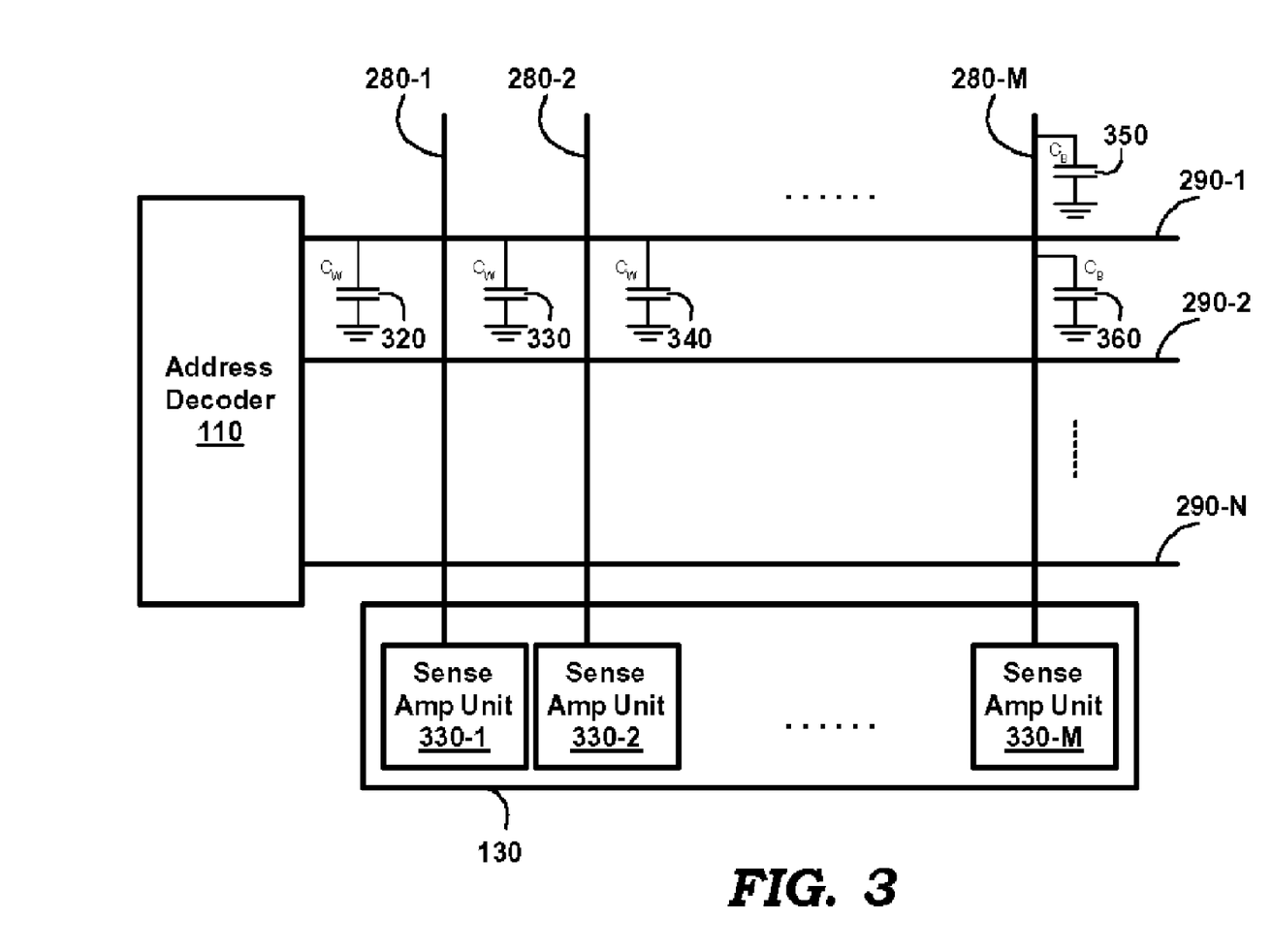
FIG. 3 illustrates the distributed capacitances that cause delay effects in the outputs of a memory array.

FIG. 3 is a block diagram of a portion of a memory unit illustrating some example challenges which need to be taken into consideration in determining optimal sensing instances in one embodiment. In particular, the manner in which various parasitic capacitances in row lines and column lines of the memory array affect the optimal sensing instances, is illustrated.

The block diagram is shown containing address decoder 110, sense amplifier block 130, and row lines 290-1 through 290-N and column lines 280-1 through 280-M (representing the organization of cells in memory array 120). Each component is described below in further detail below.

Sense amplifier block 130 is shown containing sense amplifier units 330-1 through 330-M, with each sense amplifier sensing the output signal received on a corresponding column line. Each sense amplifier unit needs to sense the corresponding column line at an appropriate time instance, and challenges may be presented due to various parasitic capacitances, as described below in further detail.

Elements 320–340 represent the distributed capacitance associated with row 290-1, and elements 350 and 360 represent the distributed capacitance associated with column line (or bit-line) 280-M. For illustration, only elements 320, 330, 340, 350, are 360 are shown as discrete elements, but the capacitance is generally distributed in various parts of the memory array. In addition, though not shown, all row lines and column lines of memory array 120 would have similar associated capacitance.

In addition, factors such as aggregate capacitance (e.g., sum of capacitance values of 350, 260, etc., for column line 280-M) cause the signal strength to increase at different rates depending on the number of rows in memory array 120. Typically, as the number of rows increases, the rate of increase is lower.

Assuming it is desirable to sense an output signal after it has reached a desired strength (for reliability), the 'delay' may be viewed as having positive correlation with the number of rows, and the optimal sense instances need to be designed taking into account such a delay as well. Further, the magnitude of delay before an address decoder 110 enables a corresponding row may also vary depending on the number of rows in memory array 120.

Additional challenges may be presented due to the internal load offered by memory cells. In an embodiment described below, each (memory) cell is implemented to provide the output signals in differential form. Accordingly the description is continued with reference to a differential implementation of a memory cell, as described below with respect to FIG. 4.

4. Cell Providing Differential Inputs

Figure 4:
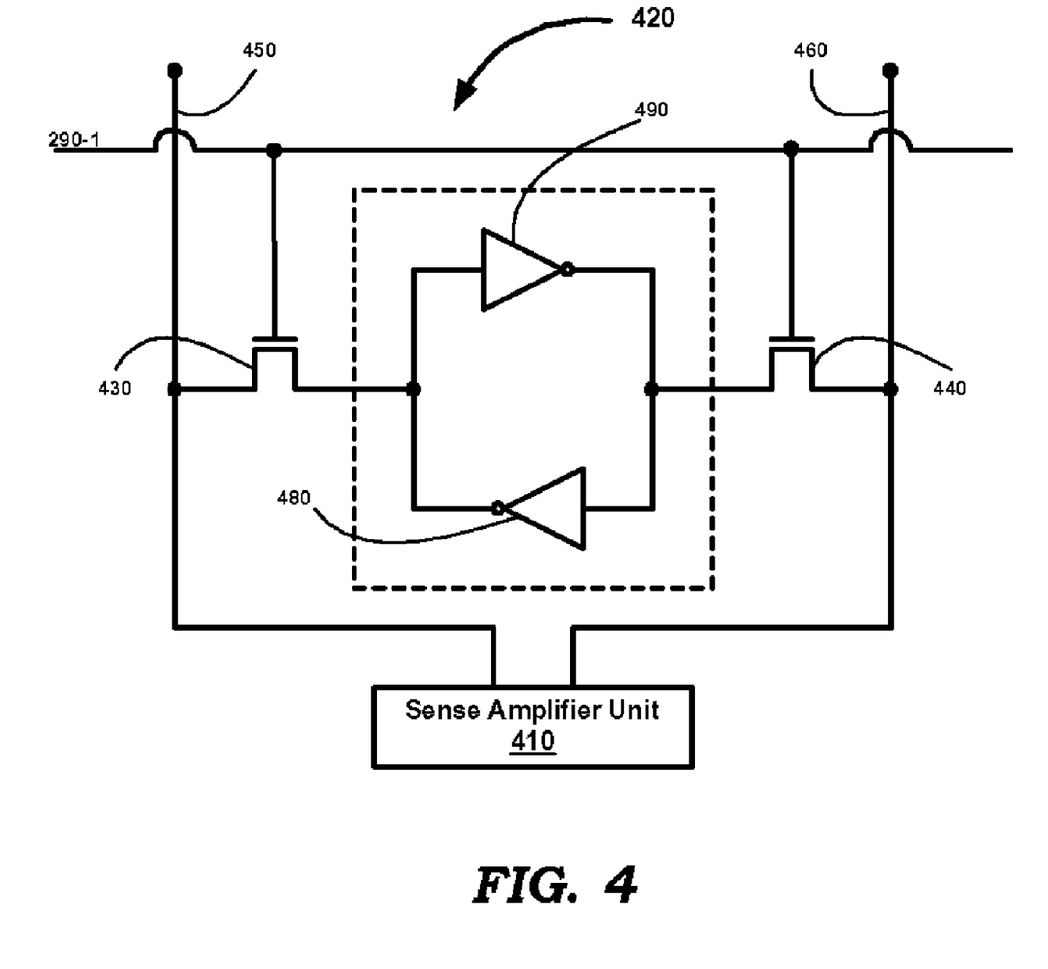
FIG. 4 shows the internal structure of a memory cell in one embodiment.

FIG. 4 illustrates in greater detail the internal structure of a memory cell and the operation of a corresponding sense amplifier unit in one embodiment. The figure is shown containing inverters 480 and 490, transistors 430 and 440, and sense amplifier unit 410. Each component is described below in further detail.

inverters 480 and 490 are connected back-to-back. The outputs of inverters 480 and 490 are complementary to each other. Outputs of inverters 480 and 490 constitute a differential voltage output which represents the value of the bit stored in memory cell 420.

Each transistor 430 and 440 connects the output of corresponding inverter 480 and 490 to bit lines 450 and 460 respectively, when row enable 290-1 is turned on. The outputs of inverters 480 and 490 are thus presented on lines 450 and 460 (contained in column line 280-M) respectively.

It may be appreciated that each transistor 430/440 also causes some delay in the (rise of signal strength of) output of memory cell 420 (due to the associated resistances and capacitances).

Sense amplifier 410, when turned ON (triggered), amplifies the difference of the strengths on bit lines 450 and 460, and compares the amplified signal with a threshold to determine whether the signal on bit lines 450/460 represents a 1 or 0. It is preferable that sense amplifier make such a determination using input signals of low strength such that the memory unit can be implemented with high speed and also low power consumption.

This differential voltage on lines 450 and 460 starts building up towards a level that is required to make a reliable determination of the value of the bit stored in the memory cell.

Due to the delay effects caused by the distributed capacitance described earlier, the differential voltage build-up occurs at different rates depending on, among other factors, the number of rows and columns in the memory array.

In compiler memory type components, it may be desirable that a sense amplifier operate with memory arrays of different dimensions, and at least in such scenarios it is necessary to trigger the sense amplifier at an optimal time instant such that stored information in the memory array may be reliably determined irrespective of the size of the memory array. This is sought to be done by using a tracking mechanism as described below.

5. Prior Tracking Mechanism

Figure 5:
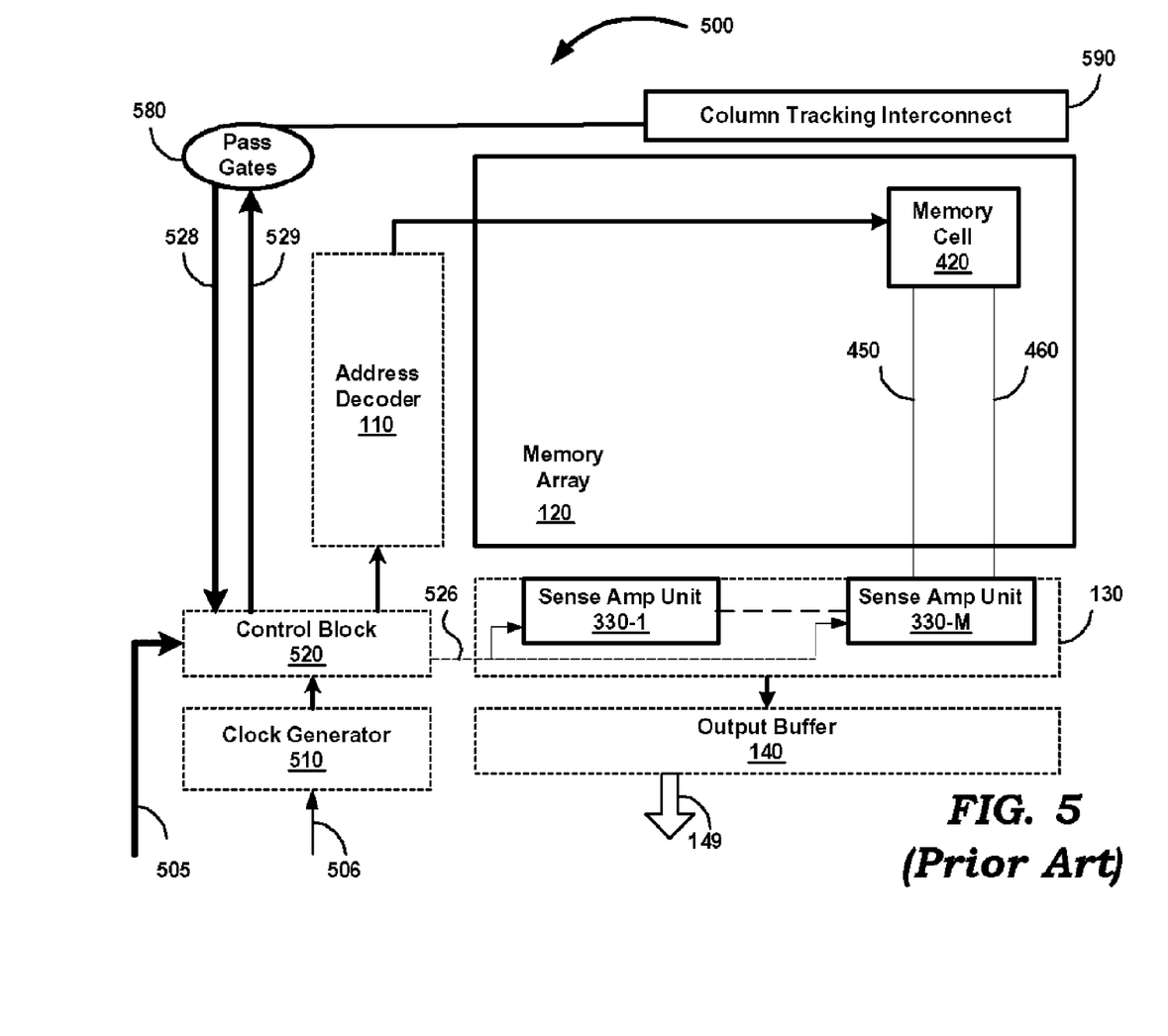
FIG. 5 illustrates an implementation of a prior tracking mechanism which generates a sense enable signal in a memory unit.

FIG. 5 is a block diagram of a prior memory unit illustrating the tracking mechanism in one embodiment. Memory unit 500 is shown containing clock generator 510, control block 520, address decoder 110, memory array 120 (including memory cell 420), pass gates 580, column tracking interconnect 590, sense amplifier 130, and output buffer 140.

Address decoder 110, memory array 120, and output buffer 140 operate as described above with reference to FIG. 1, and the description is not repeated in the interest of conciseness. Each of sense amplifier units 330-1 through 330-M (contained in sense amplifier 130) senses the output signal on column lines 280-1 through 280-M at time instances specified by sense enable signal 526.

Clock generator 510 receives a clock signal on path 506 (from an external source, not shown), and generates a negative clock pulse at the instant the clock signal is received through path 506. The negative (1 to 0) transition and the positive (0 to 1) transition of the clock pulse respectively represent the start and end of operations needed for reading a word from memory array 120. Clock generator 510 also forwards the internally generated negative clock pulse to control block 520.

Control block 520, interconnect elements 528 and 529, pass gates 580 and column tracking interconnect 590 operate to generate sense enable signal 526, as described below in further detail.

Elements 529 and 528 are electrical interconnect elements and provide forward and return paths respectively for the tracking pulse generated by control block 520. These interconnect elements have distributed capacitances associated with them and are designed to emulate the delays caused by the distributed capacitance (e.g., 350 and 360) on a column line in the memory array 120.

Pass gates 580 are implemented as digital gates, designed to emulate the delays caused by the series NMOS transistors (shown as 430 and 440 in FIG. 4) in memory cells in memory array 120.

Column tracking interconnect 590 is an electrical interconnect element and is designed to emulate the delays caused by the distributed capacitance (e.g., 320, 330 and 340) on a row in memory array 120.

Control block 520 forwards the address received on path 505 (from an external system) to address decoder 110. In addition, control block 520 generates a tracking pulse (on interconnect path 529) upon receiving a negative transition of the clock pulse from clock generator 510. Control block 520 generates the trigger (sense enable) signal for the sense amplifiers on the sense amplifier block 130 upon receiving the tracking pulse on interconnect path 528.

The delay experienced by the tracking pulse in propagating through various components (before being received by control block 520) represents a measure of the delay to be used in generating the sense enable signal since interconnect elements 528/529 emulate delay due to capacitance associated with the column lines, column tracking interconnect 590 emulates the delay due to capacitance associated with the rows, and pass gates 580 emulate the delay associated with the series N-MOS transistors (430/440) in a memory cell.

Thus, when the trigger pulse returns to control block 520 on interconnect element 528, control block 520 generates an enable(trigger) signal which turns ON (enables) the sense amplifier units. Thereafter, when the clock pulse generated by the internal clock generation unit 510 transitions from 0 to 1, control block 520 resets (drives the tracking pulse to an invalid state) and disables (turns OFF) the sense amplifiers. The read operation again starts with the reception of rising edge on path 506.

The above described approach to a tracking mechanism has several drawbacks, some of which are described below:

As described earlier, elements 529 and 528 are designed so that they emulate, as accurately as possible, the delays caused by the distributed capacitance on a column line in the memory array 120. The parameters of these elements (for example length, width and thickness) are chosen based on simulation models of the actual memory array. Any inaccuracies or changes in the simulation models will result in less than optimal values chosen for the parameters for these elements.

Also, there is often a mismatch between pass-gates 580 and the series transistors in the memory cell structure that they emulate.

In addition, this technique may result in significant distortion (large rise and fall times) of the tracking pulse for larger configurations (larger number of rows), thus resulting in unreliable operation of the sense amplifier, especially for larger configuration memory arrays.

Due to such factors described above, the timing of the enable (trigger) signal to the sense amplifiers may be less than optimal. Various aspects of the present invention overcome at least some of such drawbacks, as described below in further detail.

6. Improved Tracking Mechanism

Figure 6:
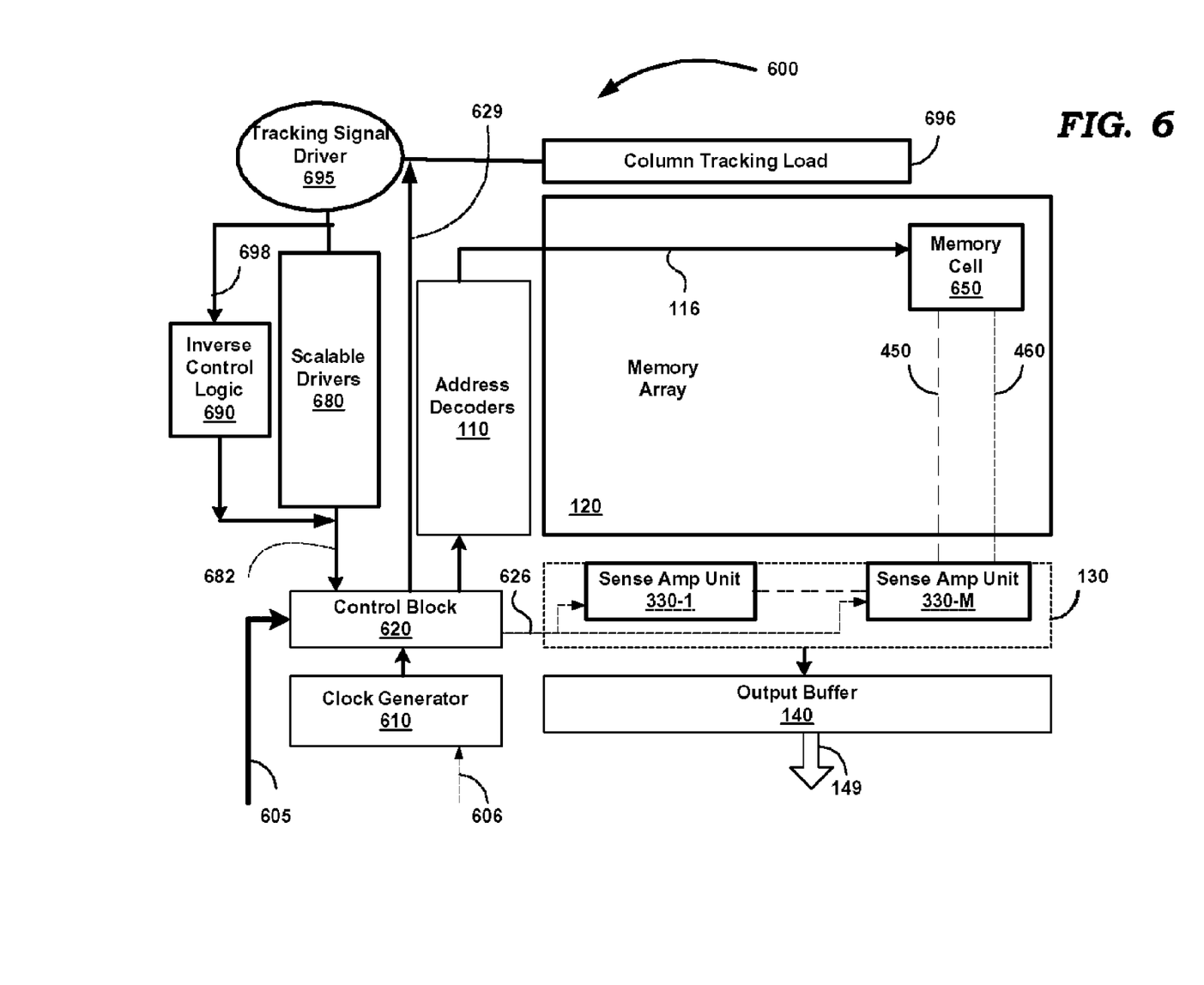
FIG. 6 is a block diagram of a memory illustrating the tracking mechanism according to various aspects of the present invention.

FIG. 6 is a block diagram of a memory unit illustrating the tracking mechanism according to an aspect of the present invention. Memory unit 600 is shown containing clock generator 610, control block 620, address decoder 110, memory array 120 (including memory cell 650), tracking signal driver 695, column tracking load 696, scalable drivers block 680, inverse control logic 690, sense amplifier block 130, and output buffer 140.

Address decoder 110, memory array 120, and output buffer 140 operate as described above, and the description is not repeated in the interest of conciseness. Each sense amplifier unit 330-1 through 330-M (contained in sense amplifier 130) senses the output signal on column lines 280-1 through 280-M at time instances specified by sense enable signal 626.

Control block 620, column tracking load 696, tracking signal driver 695, scalable drivers 680 and inverse control logic 690 operate to generate sense enable signal 626 (and thus operate as a tracking circuit), as described below in further detail.

Column tracking load 696 may be implemented as an electrical interconnect element and be designed to emulate the delays caused by the distributed capacitance on a row in memory array 120. Column tracking load 696 may be implemented similar to column tracking interconnect 590.

Clock generator 610 receives a clock signal on path 606 (from an external source, not shown), and generates a negative clock pulse at the instant the clock signal is received on path 606. The negative (1 to 0) transition and the positive (0 to 1) transition of the clock pulse respectively represent the start and end of operations needed for reading a word from memory array 120. Clock generator 610 also forwards the internally generated negative clock pulse to control block 620.

Tracking signal driver 695 receives a start pulse from control block 620, and drives both scalable drivers block 680 and inverse control logic 690 (on paths 698 and 699 respectively) with a positive pulse. The tracking signal driver 695 is implemented as a buffer, whose drive strength is designed to be equal to that of driver which drives a row enable signal on a row line on path 116.

Scalable drivers block 680 contains a number of (dummy) cells which are organized as a single column and connect to a dummy column line designed to substantially replicate the (capacitive) delays caused by a column line (in propagating the positive pulse to control block 620). Using such cells facilitates scalable drivers block 680 to emulate the delays caused in case of large number of rows (in memory arrays) accurately. The implementation of scalable drivers block 680 in one embodiment is described below in greater detail with reference to FIGS. 7 and 8.

However, in case of a small number of rows, the scalable drivers block 680 may not, by itself, facilitate accurate emulation of the delays experienced in a column line of memory array 120 (for reasons described in below sections). Inverse control logic 690 (along with connectivity to control block 620) operates to correct such a situation, as described below (with reference to FIG. 7 in further detail).

Inverse control logic 690 is designed to emulate the delay of memory array 120 in case of a small number of rows, and the positive pulse is propagated quickly (ahead of scalable drivers block 680) in such a scenario. However, in case of large number of cells, the positive pulse is propagated not faster than scalable drivers block 680. In an embodiment, inverse control logic 690 is realized as a pair of inverters and a NMOS transistor connected in series, as described below with respect to FIG. 7 below.

Control block 620 forwards the address received on path 605 (from an external system) to address decoder 110. In addition, control block 620 generates a start pulse upon receiving a negative transition of the clock pulse from clock generator 610. The start pulse is generated with a delay equaling the delay which would be encountered in decoding the address of a row in address decoder 110. In an embodiment, the delay is fixed and determined by the designer of the memory unit.

Control block 620 asserts sense enable signal 626 upon receiving a return pulse from either inverse control logic 690 or scalable drivers block 680. As may be appreciated from the description above (and also the description below with respect to FIG. 7), the return pulse received from scalable drivers block 680 accurately reflects the sense instances in case of large number of rows. On the other hand, for small number of rows, inverse control logic 690 accelerates the sense instance (or generation of sense enable signal 626).

From the above, it may be appreciated that control block 620 generates start pulse with a delay including the delay of address decoder 110, column tracking load 696 would cause a delay equaling the delay caused by the capacitance of a row, and the combination of tracking signal driver 695, scalable driver 680 and inverse control logic 690 cause a delay equaling the delay caused by the capacitance of a column line. As each of the components (substantially) accurately emulates the corresponding delay, the sense instances may be accurately determined.

However, as noted above, inverse control logic 690 operates to provide the return pulse in case of small number of rows and scalable drivers 680 provides the return pulse otherwise. The description is continued with an example implementation of inverse control logic 690 and scalable drivers 680 in tracking the delay caused by the capacitance in a column line.

7. Inverse Control Logic and Scalable Drivers

Figure 7:
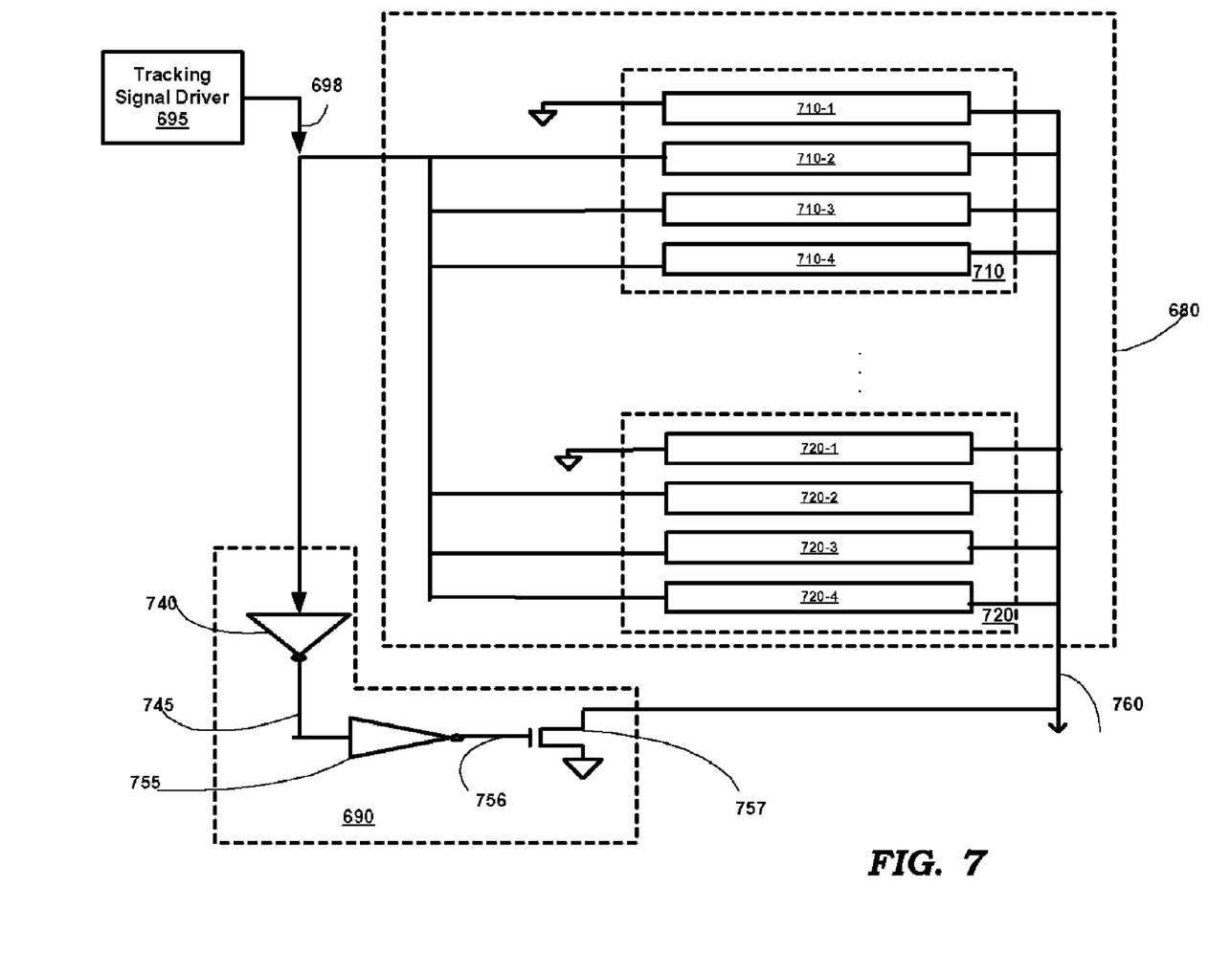
FIG. 7 shows the details of scalable drivers and inverse control logic contained in a tracking mechanism in an embodiment of the present invention.

FIG. 7 illustrates the details of inverse control logic 690 and scalable drivers 680 in emulating the delay caused by capacitance in a column line in one embodiment. Scalable drivers block 680 is shown containing blocks 710-1 through 710-4, and 720-1 through 720-4. Inverse control logic 690 is shown containing inverters 740 and 755, and NMOS transistor 756.

Each of blocks 710-1 through 710-4 and 720-1 through 720-4 represents a dummy cell which is connected to dummy column line 760, each of such dummy cells having a drive strength equaling the drive strength of the memory cells used in memory array 120. In one embodiment, scalable drivers block 680 contains one of blocks shown as 710-1 through 710-4 and 720-1 through 720-4 for every 8 rows in the memory array 120, and has a structure shown in FIG. 8. Blocks 710-1 and 720-1 are permanently disabled(by connection to circuit ground), and hence do not output a signal on dummy column line 760, while blocks 710-2 through 710-4 and 720-2 through 720-4 output a logic 0 signal on column line 760, when enabled. Blocks 710-1 and 720-1, thus, cause dummy column line 760 to be loaded.

Figure 8:
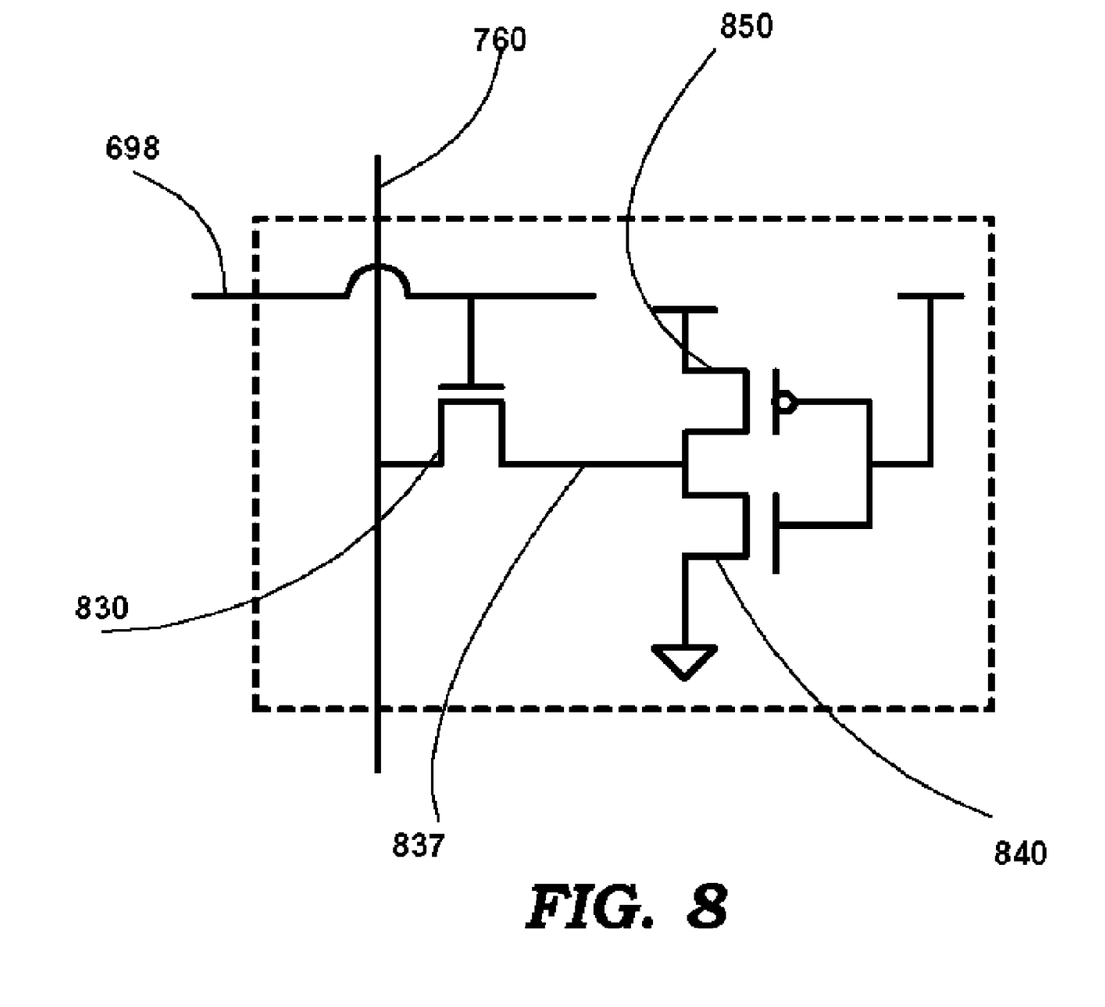
FIG. 8 is a circuit diagram illustrating the details of a dummy cell used in a tracking circuit in an embodiment of the present invention.

With respect to FIG. 8, PMOS transistor 850 and NMOS transistor 840 form a CMOS switch with input connected to power 860. The output of CMOS switch (on path 837) is a logic 0. Thus, when tracking signal driver 695 drives path 698 to 1, transistor 830 is turned on. Consequently, CMOS switch drives column line 760 to 0. The transistors forming the CMOS switch, as well as transistor 830, are fabricated to be identical to the corresponding elements in the memory array/cells.

Continuing with reference to FIG. 7, the drive strength of each block 710-2 through 710-4 and 720-2 through 720-4 when turned ON, is identical to that generated by the memory cells in memory array 120. As the capacitance of column line 760 would also substantially equal the capacitance of the column line of the memory array, the delay in propagation of the return pulse on path 760 would substantially equal the delay on the column line in the memory array.

In a group of four blocks 710-1 through 710-4, each of three blocks 710-2, 710-3 and 710-4, outputs (drives) a signal on dummy column line 760, while one block 710-1 acts as a load. Since one group of blocks 710-1 through 710-4 is used for every 8 rows in the memory array 120, it can be appreciated that there would be a large number of drivers (similar to blocks 710-2 through 710-4) in the case of larger configurations (large number of rows). Hence scalable drivers 680 propagates the positive pulse 698 (as return pulse on path 760) as fast as inverse control logic 690.

For smaller configurations (smaller number of rows), however, there are proportionately smaller number of blocks 710-2 through 710-4, and therefore disproportionately fewer drivers (similar to blocks 710-2 through 710-4) in comparison to the load on dummy column 760 due to non-driving blocks (similar to 710-1) and the increased capacitance. Therefore, for smaller configurations, scalable drivers 680 propagate the positive pulse 698 (as return pulse on path 760) slower than required. This is corrected by the inverse control logic 690. Inverse control logic 690 propagates the positive pulse (as return pulse on path 760) sooner in case of small number of rows as described below.

Inverters 740 and 755 are connected in series and thus propagate the signal received on path 698. NMOS transistor 757 pulls down path 760 when the output of inverter 755 (on path 756) is at logic 1. Thus, by designing the drive strengths of inverters 740 and 755, and NMOS transistor 757, the maximum time delay by which the high to low transition has to occur on path 760 can be controlled. In case scalable drivers block 680 cause such a transition sooner, inverse control logic 690 does not affect the signal level on path 760, as desired.

From the above, it may be appreciated that the sense instances are more accurately determined due to the approaches described above. The description is continued with respect to a timing diagram.

8. Timing Diagram

Figure 9:
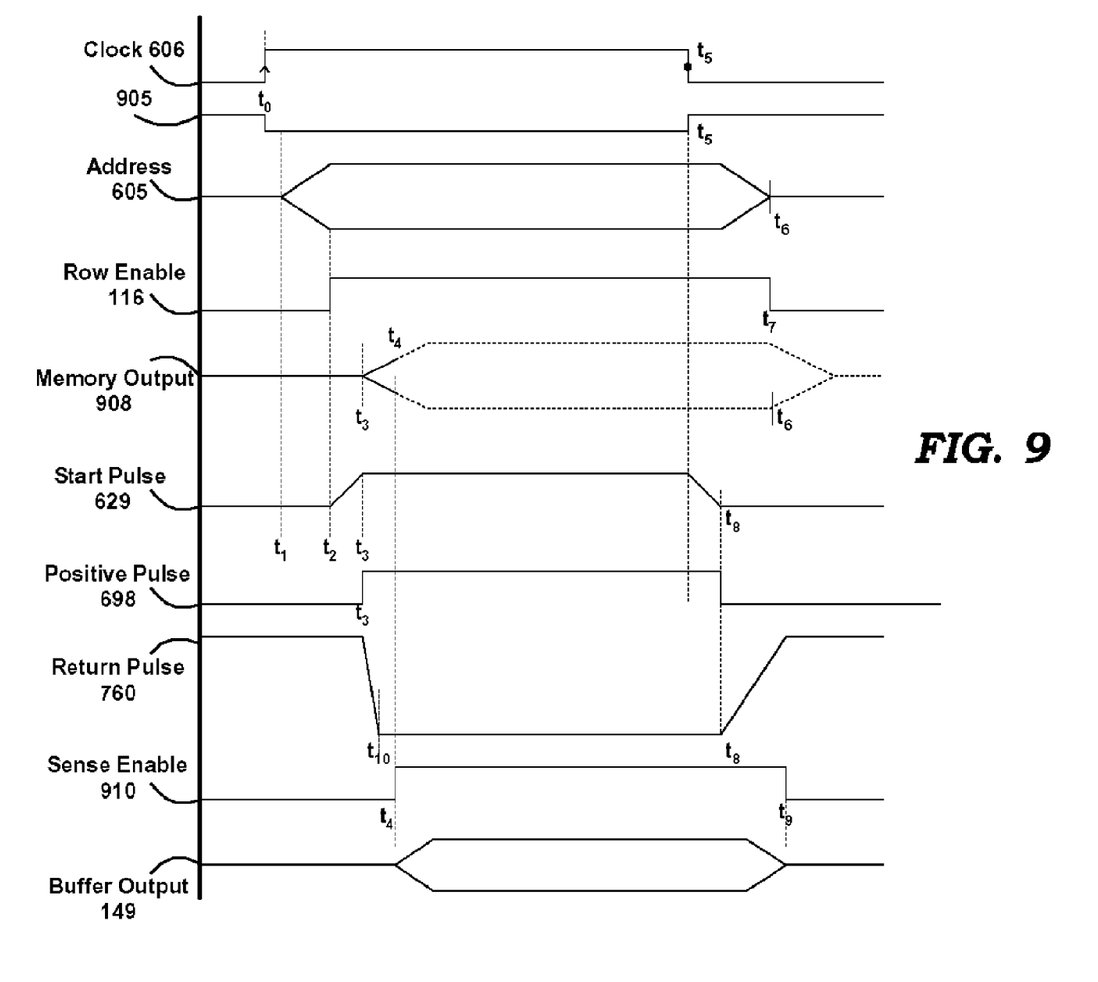
FIG. 9 is a timing diagram illustrating the timing relationships in the operation of various components of a memory unit in one embodiment.

FIG. 9 is a timing diagram illustrating the operation of a memory unit in an embodiment according to various aspects of the present invention. The read operation starts on the rising edge of clock 606 at time instance t0. Clock generator 610 generates an internal signal 905 having a pulse following the rising edge at t0. The memory address is provided from an external system at time instance t1 (around t0) as shown.

Address decoder 110 generates a row enable signal 116 at time point t2. The row enable reaches the cells of interest at time point t3, at which point the memory cell output voltage 908 starts build-up towards a value representing the bit stored. Control block 620 generates a start pulse 629 at time instance t2, which arrives at tracking signal driver 695 at time instance t3.

Tracking signal driver 695 generates positive pulse 698 at time instance t3. Return pulse (on path 760) starts transitioning to logic 0 at t3 and reaches logic 0 at t10.

Control block 620 generates sense enable signal 910 at time instance t4. Memory array output is available to the external system on path 149 at time t4. At time t5, clock signal 606 returns to 0, indicating the end of a read cycle. Clock pulse 905 returns to a logic 1 at t5, as shown.

External system removes address on path 605 at time instance t6. Row enable signal 116 returns to 0 at time t7. Memory output voltage 908 starts returning to zero at t6. Start pulse 629 starts return to 0 at time instance t5 and reaches logic 0 at t8. Positive pulse 698 returns to 0 at t8. Return pulse (on path 760) starts returning to logic 1 at t8. Sense enable 910 transitions to logic 0 at t9. Buffer output on path 149 contains the output bit value after t4 and transitions to tri-state logic after t9.

It should be appreciated that duration t1–t2 represents the delay in address decoder 110 and is emulated by control block 620 by adding a delay to start pulse 629 (and generating the positive transition around t2, as shown). Duration t2–t3 represents the delay caused by the capacitance on the row and is emulated by column tracking load 696. Duration t3–t10 represents the delay due to the capacitance on a column line, and is emulated by scalable drivers block 680 and inverse control logic 690, as described above.

Thus, memory units provided according to various aspects of the present invention may generate sense enable signals at optimal time points.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents. Also, the various aspects, features, components and/or embodiments of the present invention described above may be embodied singly or in any combination in a data storage system such as a database system and a data warehouse system.

What is claimed is:

1. A memory unit comprising:
   a memory array containing a plurality of memory cells organized as a plurality of rows and a plurality of columns, each of said plurality of memory cells storing a corresponding bit value;
   a plurality of column lines, with each column line providing a common path for the outputs of cells in a corresponding one of said plurality of columns;
   a plurality of row enable signals, with each row enable signal enabling the cells in a corresponding one of said plurality of rows causing the cells to provide the corresponding bit values on said plurality of column lines;
   a decoder receiving a row address and enabling one of said plurality of row enable signals according to said row address;
   a plurality of sense amplifier units, with each of said plurality of sense amplifier units being connected to receive a corresponding bit value on a corresponding one of said plurality of columns, said plurality of sense amplifier units sensing said plurality of columns according to a sense enable signal; and
   a tracking circuit generating said sense enable signal at optimal time instances, said tracking circuit comprising:
      a scalable drivers block containing a plurality of dummy cells connected by a dummy column, each of said dummy cells having a drive strength identical to that of said plurality of cells, said scalable drivers block receiving a first pulse and generating a first transition with a delay substantially equaling the delay with which said bit values would be propagated on corresponding columns; and
      a control block receiving said first transition and generating said sense enable signal in response.

2. The memory unit of claim 1, wherein said scalable drivers block contains a number of dummy cells which is a fraction of a number of memory cells in each column of said memory array.

3. The memory unit of claim 1, wherein said tracking circuit further comprises an inverse control logic block which generates a second transition, wherein said control block generates said sense enable signal in response to receiving said first transition or said second transition, said inverse control logic block generating said second transition sooner than when said scalable drivers generate said first transition in case of a small number of rows in said memory unit.

4. The memory unit of claim 3, wherein said control logic generates said sense enable signal in response to receiving a transition on a common path, wherein said scalable drivers block and said tracking circuit are coupled to provide said first transition and said second transition on said common path.

5. The memory unit of claim 3, wherein said inverse control logic comprises:
   a plurality of inverters connected in series, said inverters propagating said first pulse; and a gate causing said second transition provided to said control block in response to receiving said first pulse.

6. The memory unit of claim 5, wherein said tracking circuit further comprises:
a column tracking load representing a load offered by each of said plurality of rows; and
a tracking signal driver generating said first pulse, said tracking signal driver receiving a start pulse from said control block on a path connecting to said column tracking load, said start pulse representing the start of a tracking operation.

7. The memory unit of claim 6, further comprising:
a clock generator indicating a start of a memory read operation,
wherein said control block generates said start pulse with a delay equaling the time that would be taken by said decoder in generating said row enable signal from said row address.

8. The memory unit of claim 7, wherein said tracking signal driver comprises a buffer having a drive strength equal to that of a driver which drives said row enable signals.

9. A device comprising:
an external system providing an access address; and
a memory unit receiving said access address, said memory unit comprising:
a memory array containing a plurality of memory cells organized as a plurality of rows and a plurality of columns, each of said plurality of memory cells storing a corresponding bit value;
a plurality of column lines, with each column line providing a common path for the outputs of cells in a corresponding one of said plurality of columns;
a plurality of row enable signals, with each row enable signal enabling the cells in a corresponding one of said plurality of rows causing the cells to provide the corresponding bit values on said plurality of column lines;
a decoder receiving said access address and enabling one of said plurality of row enable signals according to said access address;
a plurality of sense amplifier units, with each of said plurality of sense amplifier units being connected to receive a corresponding bit value on a corresponding one of said plurality of columns, said plurality of sense amplifier units sensing said plurality of columns according to a sense enable signal; and
a tracking circuit generating said sense enable signal at optimal time instances, said tracking circuit comprising:
a scalable drivers block containing a plurality of dummy cells connected by a dummy column, each of said dummy cells having a drive strength identical to that of said plurality of cells, said scalable drivers block receiving a first pulse and generating a first transition with a delay substantially equaling the delay with which said bit values would be propagated on corresponding columns; and
a control block receiving said first transition and generating said sense enable signal in response.

10. The device of claim 9, wherein said scalable drivers block contains a number of dummy cells which is a fraction of a number of memory cells in each column of said memory array.

11. The device of claim 9, wherein said tracking circuit further comprises a inverse control logic block which generates a second transition, wherein said control block generates said sense enable signal in response to receiving said first transition or said second transition, said inverse control logic block generating said second transition sooner than when said scalable drivers generate said first transition in case of a small number of rows in said memory unit.

12. The device of claim 11, wherein said control logic generates said sense enable signal in response to receiving a transition on a common path, wherein said scalable drivers block and said tracking circuit are coupled to provide said first transition and said second transition on said common path.

13. The device of claim 11, wherein said inverse control logic comprises:
a plurality of inverters connected in series, said inverters propagating said first pulse; and
a gate causing said second transition provided to said control block in response to receiving said first pulse.

14. The device of claim 13, wherein said tracking circuit further comprises:
a column tracking load representing a load offered by each of said plurality of rows; and
a tracking signal driver generating said first pulse, said tracking signal driver receiving a start pulse from said control block on a path connecting to said column tracking load, said start pulse representing the start of a tracking operation.

15. The device of claim 14, further comprising:
a clock generator indicating a start of a memory read operation,
wherein said control block generates said start pulse with a delay equaling the time that would be taken by said decoder in generating said row enable signal from said row address.

16. The device of claim 15, wherein said tracking signal driver comprises a buffer having a drive strength equal to that of a driver which drives said row enable signals.

* * * * *